(12) United States Patent
Kimoto et al.

(10) Patent No.: US 6,652,212 B2
(45) Date of Patent: Nov. 25, 2003

(54) CYLINDER, LOAD PORT USING IT, AND PRODUCTION SYSTEM

(75) Inventors: Shinyo Kimoto, Kanagawa (JP); Kenji Tokunaga, Kanagawa (JP); Katsunori Sakata, Fukayasu-Gun (JP); Norio Kajita, Aichi-Ken (JP)

(73) Assignees: CKD Corporation, Aichi-Ken (JP); Semiconductor Leading Edge Technologies, Inc., Kanagawa (JP); Rorze Corporation, Horoshima-Ken (JP)

( * ) Notice: Subject to any disclaimer, the term of this patent is extended or adjusted under 35 U.S.C. 154(b) by 49 days.

(21) Appl. No.: 09/999,464

(22) Filed: Oct. 31, 2001

(65) Prior Publication Data

US 2002/0033606 A1 Mar. 21, 2002

Related U.S. Application Data

(63) Continuation-in-part of application No. 09/561,634, filed on May 2, 2000.

(30) Foreign Application Priority Data

Sep. 3, 2001 (JP) ........................................ 2001-266449

(51) Int. Cl.⁷ ................................ H01J 5/02; E05C 5/02
(52) U.S. Cl. ......................... 414/217; 414/940; 292/59; 250/239
(58) Field of Search ....................... 91/44, 45; 92/85 A; 414/217.1, 407, 940, 939; 292/59, 57; 250/239

(56) References Cited

U.S. PATENT DOCUMENTS

| | | | | |
|---|---|---|---|---|
| 3,395,618 A | * | 8/1968 | Fredd | 92/24 |
| 3,863,545 A | * | 2/1975 | Kesti | 91/45 |
| 4,116,113 A | * | 9/1978 | Leclerc | 92/24 |
| 4,524,676 A | * | 6/1985 | Rogers | 91/43 |
| 5,193,431 A | * | 3/1993 | Propsting et al. | 92/21 MR |
| 5,275,540 A | * | 1/1994 | Brown | 417/404 |
| 5,365,828 A | * | 11/1994 | Sperber et al. | 91/41 |
| 5,915,562 A | | 6/1999 | Nyseth et al. | |
| 5,980,183 A | | 11/1999 | Fosnight | |
| 6,082,951 A | * | 7/2000 | Nering et al. | 414/217.1 |
| 6,382,896 B1 | * | 5/2002 | Hu et al. | 414/217 |
| 6,501,070 B1 | * | 12/2002 | Bacchi et al. | 250/239 |
| 6,502,869 B1 | * | 1/2003 | Rosenquist et al. | 292/59 |

FOREIGN PATENT DOCUMENTS

| | | |
|---|---|---|
| JP | 01-154306 | 10/1989 |
| JP | 06-323305 | 11/1994 |
| JP | 08-279546 | 10/1996 |
| JP | 11-145245 | 5/1999 |
| JP | 11-168137 | 6/1999 |
| JP | 2001-248610 | 9/2001 |

* cited by examiner

Primary Examiner—Eileen D. Lillis
Assistant Examiner—Charles A. Fox
(74) Attorney, Agent, or Firm—Baker & Daniels

(57) ABSTRACT

A cylinder of the invention can precisely send out a piston rod 3 into four different positions and comprises: a spring receiving member 14 placed coaxially with piston rod 3 in a piston room (I–II) of a cylinder tube 2 so that the movement of spring receiving member 14 is limited by one end of the piston room; a first spring member 15 to separate the spring receiving member from the piston; a stopper 8 formed on piston rod 3 to limit spring receiving member 14 from moving in the opposite direction to piston 4, a hollow 9 formed on the periphery of piston rod 3 at farther position from piston 4 than stopper 8; and a stop pin 11 installed in the cylinder tube to be pressed in the direction of hollow 9 by a second spring member 12 to engage with hollow 9, wherein the movable length of piston rod 9 while stop pin 11 is engaged with hollow 9 is larger than movable distance of spring receiving member 14 from the piston. A load port and a production system of this invention are constructed using the cylinder.

12 Claims, 14 Drawing Sheets

(A)

(B)

(A)

(B)

(C)

CYLINDER, LOAD PORT USING IT, AND PRODUCTION SYSTEM

This is a continuation-in-part of U.S. patent application Ser. No. 09/561,634, filed on May 2, 2000.

BACKGROUND OF INVENTION

1. Field of Invention

This invention relates to a cylinder, a load port using it and a production system using the load port, and in particular, to a load port which complies with the SEMI standard and is suitable for FOUPs (Front Opening Unified Pods) having a variety of latchkey receptacle shapes.

2. Description of the Related Art

Until now, open cassettes have been mainly used as a container which stores a plurality of semiconductor wafers. However, in order to reduce the production cost of high-performance semiconductor devices, the mini-environment systems have been advocated, which reduce the cost related to a clean room. In the mini-environment systems, the SMIF (Standard Mechanical Interface) system is widely used for 200 mm-wafers, and the FOUP (Front Opening Unified Pod) system is being examined to be used for 300 mm-wafers.

The FOUP system was advocated and provisionally standardized at SEMI (Semiconductor Equipment and Materials International) composed of semiconductor manufacturing equipment manufacturers and material manufacturers all over the world. Semiconductor device manufacturers are also preparing to construct the mass-production line with this system. The FOUP system was technically examined at the standard committee of SEMI and was provisionally standardized. Here, the SEMI standard E57-0299 strictly defines the accuracy of the load port mechanical interface method to open and close an FOUP door; on the other hand, it allows FOUP manufacturers more latitude in adopting mechanical interface of FOUP.

The FOUP system, for example, is described in detail in JP8-279546A. The structure and the opening and closing mechanism of FOUP are explained by referring to FIGS. 12 and 13. FIG. 12 is a perspective view of a load port carrying out the opening and closing of FOUP door. Here, load port 30 is composed of frame 31 having a opening, stage 32 which is enable to move in the frame direction and has three kinematic pins 34 on the surface, and port door 33 which is inserted into the opening from opposite direction to stage 32 and retracted from the opening. In port door 33, two registration pins 36 are mounted diagonally, and two latchkeys 35 that rotate between the vertical position (90-degree position) and the horizontal position (0-degree position) are installed. Additionally, holding pads 37 are installed surrounding respective registration pins 36 to fix FOUP door 52 to port door 33.

FOUP 50 is composed of FOUP box 51 and FOUP door 52, as is shown in FIG. 13. FOUP box 51 has a plurality of shelves to hold wafers 53 and handles 58 for carrying by hand. In FOUP door 52, latch holes 55 and registration holes 54 are formed at corresponding positions to latchkeys 35 and registration pins 36 of port door 33. Inside latch holes 55, a latchkey receptacle is installed to engage with latchkey 35. The locking and unlocking operation of latches 56 is carried out by turning the latchkey receptacles using the latchkeys.

It is stipulated in the SEMI standard that fixing and unfixing of FOUP door 52 to and from FOUP box 51 is made by turning the latchkey receptacles to the positions of the 90-degree and the 0-degree, respectively. However, there is no concrete stipulation on the fixing method of FOUP door, and therefore, FOUP manufacturers are allowed to adopt their own method. The opening and closing mechanism of FOUP door is described in, for example, U.S. Pat. No. 5,915,562.

One of the FOUP opening and closing operations will be explained below. An FOUP is placed on stage 32 having three kinematic pins 34 mounted thereon and is aligned with the aid of the kinematic pins. Then, stage 32 is moved forwards to insert registration pins 36 of the port door into registration holes 55 of FOUP 50, whereby the FOUP door is positioned against the port door. Further advance of the stage makes latchkeys 35 of the port door engage with latchkey receptacles through latch holes 55 of FOUP, and the FOUP door finally contacts with the port door. At this stage, the inside of holding pads 37 installed around the root of registration pins 36 are evacuated to fix the FOUP door to the port door.

Then, the FOUP door is detached from the FOUP box by turning latchkeys 90 degrees to the 0-degree position. The port door, holding the FOUP door, is moved backwards and then downwards. Thus, wafers can be taken out through the opening. Each wafer stored in the FOUP box is transferred by e.g. a scalar type robot disclosed in JP No.2749314 to a wafer process tool.

When the FOUP door is closed, the same operation is made in reverse order.

This FOUP system was established as a provisional specification of SEMI in 1996, and each company has developed and manufactured FOUPs and load ports on the basis of this standard. Various disadvantages about the FOUP system have been clarified with advancing the verification of operation.

As mentioned above, there is few stipulation on FOUP, in spite of strict stipulation on the load port: for example, the shape and size of latchkey are defined including their tolerance, but those of latchkey receptacle are not. Therefore, the following problems have arisen. According to the SEMI standard E62-0999, the tolerance on the rotation angle of latchkey is defined as ±1 degree at the 0-degree position and 90-degree position. However, since there is no stipulation on the size of the latchkey receptacle, latchkey receptacles may not rotate 90 degrees even if latchkeys rotate by 90 degrees, as shown in FIG. 8(A), in the case where the width W1 of latchkey receptacles 57 is to some extent larger than the width W2 of latchkey 35. That is, latchkey receptacles may not rotate to the 90-degree position, but to the (90−θ) degree position depending on the difference of (W1−W2), which results in failing to lock the latches. The latchkey receptacles happen not to be at the 90-degree position even though the latches have been locked. When this FOUP is transported to the load port of next process tool and the stage thereof is moved forwards to open the FOUP, the latchkeys may contact or collide with latchkey receptacles of the FOUP door. The contact or collision causes dust generation and contaminates the wafer transferring space. Furthermore, the repetition of the contact and collision may deform the latchkey receptacles and finally destroy the FOUP door. If the latchkey receptacle is deformed, they cannot rotate to the 0-degree position when latchkeys rotate to the 0-degree position. Thus, latchkey receptacles will stop at e.g., 5 degrees that is out of tolerance range of ±1 degree. As a result, the FOUP door cannot be detached from FOUP box, which is a severe disadvantage in the manufacturing process of semiconductor devices and the like.

Although each FOUP manufacturer has carried out various examinations in order to solve the above problems, the appropriate solution has not been obtained from the viewpoint of cost and reliability.

Then, the inventors have developed the load port which can make latchkey receptacles into the 90-degree position by rotating the latchkeys more than 90 degrees when to lock the latches (Japanese Patent Application 2000-59654). This makes possible the stable latching operation. However, it was found in the case of the production system including a conventional load port that the latchkey receptacle angle often greatly deviated from 90 degrees depending on the type of FOUP and that the latchkey contacted the latchkey receptacle to damage. This will be explained using FIG. 14.

FIG. 14 is a graphical representation showing the latchkey receptacle angles for two types of FOUP after latches are locked. Here, the production system is composed of conventional load ports (C and G) and new type load ports (A, B, D, E, F, and H). The latchkey receptacles were made at almost 90 degrees for any FOUP when the latches were locked using the new type load port (A, B, D, E, F, and H), but they happened to be at about 86 degrees when the conventional load port (C and G) is used. When this FOUP is transported to the next load port, the latchkeys contacted the latchkey receptacles and caused the damage in the latchkey receptacles even if the next load port was a new type (D or H).

SUMMARY OF THE INVENTION

Under such circumstances, the object of the present invention is to provide the load port which makes it possible for FOUP whose latchkey receptacles are not at the 90-degree position to certainly insert latchkeys into latchkey receptacles without causing the damage in the latchkey receptacles when the stage moves forwards to open FOUP.

The further object of this invention is to provide a smaller-sized cylinder suitably used for the load port. Another object of this invention is to provide a production system which enables the mass-production with high reliability of semiconductor integrated circuits.

In order to solve the above-mentioned problems, the inventors examined the insertion method of a latchkey to a latchkey receptacle and the latching mechanism in detail by using a cylinder as a driver of latchkey. It has been found as a result of these examinations that by making the latchkeys freely rotatable when the latchkeys are being inserted into the latchkey receptacles, the latchkeys are rotated following the latchkey receptacle angle of (90−α) to be smoothly inserted into the latchkey receptacles as shown in FIG. 8(C). Thus, the damage of the latchkey receptacles and the dust generation can be avoided. Here, the behavior that the latchkey begins to rotate when it contacts the latchkey receptacle to adapt to (or compensate) the angle deviation (α) and is smoothly inserted into the latchkey receptacle is shown in plan and sectional views of FIGS. 9(B)–9(D). FIG. 9(A) is a schematic diagram showing the configuration of the latchkey and the latchkey receptacle.

In addition, when the FOUP door is closed by locking latches, as shown in FIG. 8(B), latchkeys are rotated more than 90 degrees (90+θ) and thereafter are returned to the 90-degree position so that latchkey receptacles may be at the 90-degree position. By this method, latches can be certainly locked for any FOUP and latchkey receptacles are returned to the 90-degree position. Thus, the stable latching operation is maintained even for the production system, which includes the conventional load ports.

This method requires a cylinder whose piston rod stops accurately at four different positions corresponding to four latchkey angles. A multiposition cylinder which makes it possible to stop the piston rod at many positions is disclosed in e.g., JP8-82305A. However, this cylinder requires four actuators for driving stoppers to stop the piston rod and therefore the size of the whole cylinder becomes too large to be installed in the port door of SEMI standard. Moreover, although it is also possible to construct a four-position cylinder by connecting the conventional cylinders, the size of the whole cylinder similarly becomes very large.

Therefore, the present inventors further studied the cylinder structure which can be miniaturized based on these knowledge, and have finally accomplished cylinders of this invention.

A cylinder of this invention in which a piston rod performs linear motion with the pressure of fluid applied to a piston through two fluid ports, is constructed so that by one stop pin, the end portion of said piston rod stops at the first position which is one end of the maximum actuation range thereof, the second position which is the other ends of the maximum actuation range, the third position which is located between the first position and the second position and nearer said second position, and the fourth position which is located between the first position and the third position and nearer the third position.

The cylinder of this invention is further characterized in that the end portion of the said piston rod can move freely between the third position and the fourth position. Here, the stop pin may be driven by, for example, fluid pressure, spring force and electromagnetic force or the like.

The cylinder of this invention which moves the piston rod among four positions specifically comprises: a spring receiving member placed coaxially with said piston rod in a piston room of a cylinder tube so that the movement of said spring receiving member is limited by one end of said piston room; a first spring member to separate said spring receiving member from said piston; a stopper formed on said piston rod to limit said spring receiving member from moving in the opposite direction to said piston; a hollow formed on the periphery of said piston rod at farther position from said piston than said stopper; and a stop pin installed in said cylinder tube to be pressed in the direction of said hollow by a second spring member to engage with said hollow, the movable length of said piston rod while said stop pin is engaged with said hollow being larger than movable distance of said spring receiving member from said piston.

Here, for instance, the four positions of the piston rod are determined by the first position where said piston comes in contact with the first end of said piston room which is opposite side of said stop pin, the second position where said spring receiving member comes in contact with the second end of said piston room and the distance between said piston and said spring receiving member becomes minimum or where said stop pin comes in contact with the piston side end of said hollow, the third position where said spring receiving member comes in contact with both said second end of said piston room and said stopper, and the fourth position where said stop pin comes in contact with the other end of said hollow.

With such structures, the four poisons of the piston rod can precisely be determined and the transfer among these positions can also be stably carried out. In addition, as compared with the tandem type cylinder made by connecting two cylinders and the cylinder disclosed in JP8-82305A, the number of component parts and accessories can be remarkably reduced, meaning that this invention has an advantage in cost reduction. As a result, it becomes possible to construct a compact, low-price, four-position type cylinder having high reliability in operation.

A load port of the present invention is composed of: a frame having an opening; a stage holding a substrate container having a front door to seal inside airtight using a latch; and a port door having a latchkey and a cylinder to rotate said latchkey, and which locks and unlocks said latch by rotating said latchkey in the state where said front door is in full contact with said port door and said latchkey is engaged with a latchkey receptacle of said front door, wherein said latchkey is rotated to adapt to the angle deviation of latchkey receptacle as said front door is brought in contact with said port door so that said latchkey is inserted to and engaged with said latchkey receptacle.

Here, as a cylinder for driving a latchkey, the cylinder of this invention mentioned above which send the piston rod to four different positions is preferably adopted.

By using the load port having the construction mentioned above, it is possible to avoid the imperfect latching operation, the damage during latchkey insertion and the dust generation. That is, the front door of FOUP can be opened without any trouble even for FOUP whose latchkey receptacles are not at 90-degree position, since the latchkeys are smoothly inserted into the latchkey receptacles following their angles, and the latchkey receptacles are returned to the 90-degree position after the front door is closed. Therefore, the collision between the latchkey and the latchkey receptacle, the damage and the particle generation can be avoided even in the production system which includes the conventional load ports.

As shown in FIG. 14, the angle (90−α) of the latchkey receptacles is generally between 86–92 degrees after the latch is locked. Therefore, the values of θ and β were set to satisfy the equations of (90+θ)=90–94° and (90−β)=85–90° to carry out the stable latching operation even for the production system, which includes the conventional load ports.

The four positions of the cylinder are determined, corresponding to these angles. That is, the first, second, third and fourth positions are respectively determined to correspond to the 0 degree (horizontal position), the angle larger than 90 degree (90+θ), 90 degree (vertical position) and the angle less than 90 degree (90−β), which enables reliable latching operation.

This structure makes possible more reliable latching operation. Additionally, this structure is compact enough to be easily installed in the port door which meets the SEMI standard.

In this invention, the load port is preferably constructed so that two latchkeys are connected and simultaneously turned by single cylinder. This reduces the number of cylinders, valves and the like and therefore reduce the cost of load port.

And a production system of this invention is characterized in that the load port of this invention is used.

BRIEF DESCRIPTION OF DRAWINGS

FIG. 4 is a plan view showing the inside of a port door that a cylinder of this invention is installed in.

DETAILED DESCRIPTION OF THE PREFERRED EMBODIMENTS

The embodiments of this invention will be explained below using the drawings.

(Cylinder)

Figure 1:
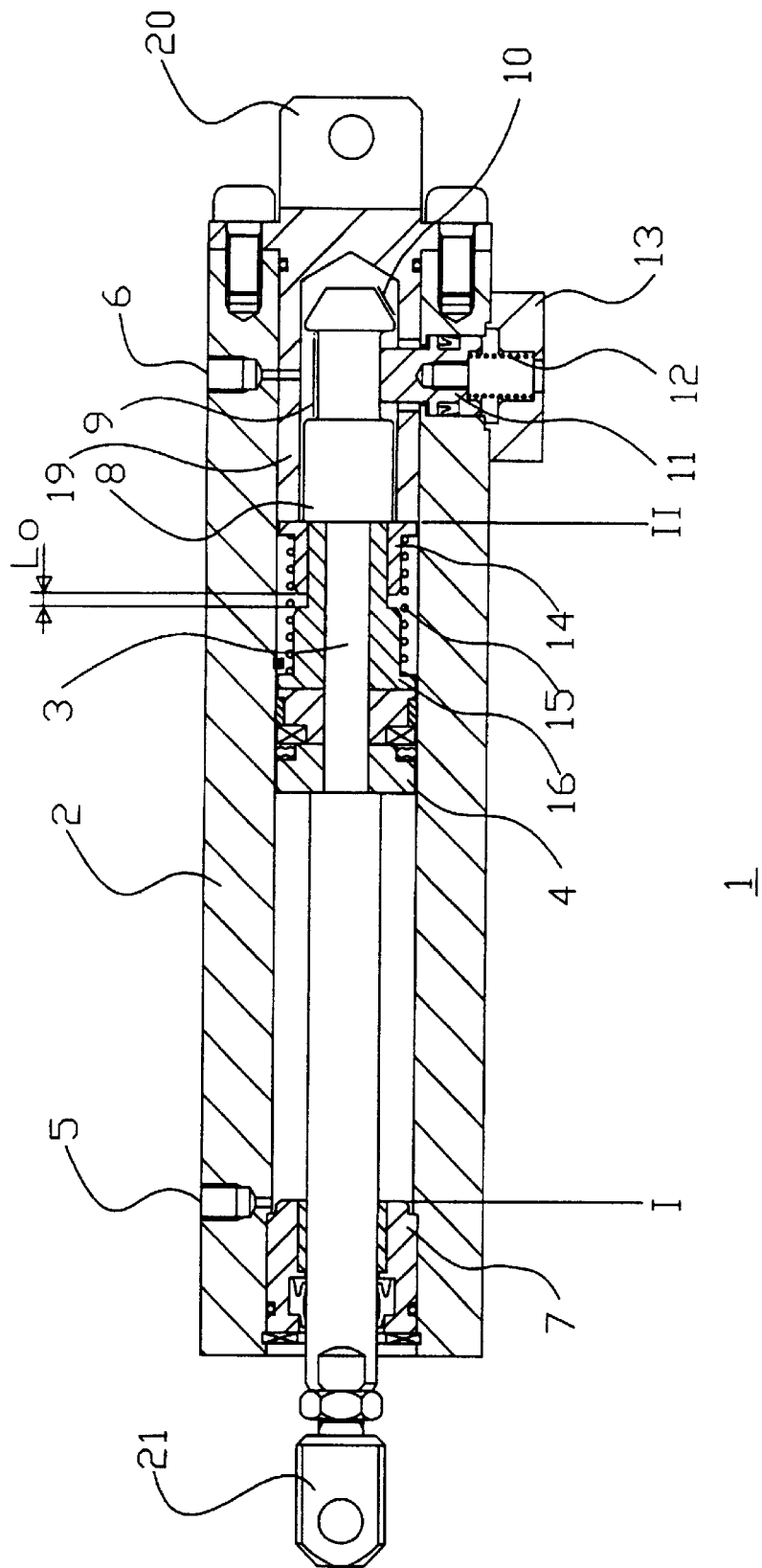
FIG. 1 is a sectional view showing the structure of a cylinder of the invention.

First, a cylinder of this invention is described by reference to FIGS. 1 and 2. FIG. 1 is a sectional view of a four-position cylinder of this invention. In the figure, numeral 2 denotes a cylinder tube, 3 denotes a piston rod, 4 denotes a piston, and 5, 6 denote a fluid port. Inside cylinder tube 2, piston chamber (I–II) with the inner diameter nearly equal to the outer diameter of piston 4 is formed between cylinder covers 7 and 19.

A stopper 8 is fixed to one end portion of piston rod 3, which has a groove, hollow, recess, hole or the like (hereinafter referred to as hollow) 9 on the periphery and a tapered portion 10 at the end. Between piston 4 and stopper 8, a spring receiving member 14, which is made of a tubular member having a flange at one end, is placed coaxially with piston rod 3.

Spring receiving member 14 can move in the axial direction and move independently of piston rod 3. Between this spring receiving member 14 and piston 4, is placed a spring 15 (a first spring member) so as to push spring receiving member 14 into the right direction. Both cylinder cover 19 and stopper 8 limit the rightward movement of spring receiving member 14. That is, stopper 8 plays a role to restrict spring receiving member 14 from moving into the right direction. In the case of FIG. 1, a spring guide member 16 that is placed to make spring 15 smoothly move along the axis is fixed to piston rod 3 and piston 4.

Furthermore, a stop pin 11 is installed in cylinder tube 2 to engage with hollow 9 formed in stopper 8. This stop pin 11 is pressed by means of a spring 12 (a second spring members) and a cover 13 towards the central axis of piston rod 3. The axial movement of piston rod 3 is also limited by engaging stop pin 11 with hollow 9, This stop pin 11 is pushed back by compressed fluid introduced in fluid port 6, and is disengaged from hollow 9.

Next, the operation of the cylinder and the method for moving the piston rod into four different positions are explained by reference to FIG. 2. FIGS. 2(A), (B), (C) and (D) show four different states of piston rod 3 where cylinder length increases in the order of (A), (D), (C) and (B) (i.e. cylinder length: L1>L4>L3>L2).

First, fluid port 5 is switched to the high pressure (H), and then fluid port 6 is switched to the low pressure (L), as is shown in FIG. 2(B). As a result, piston rod 3 is pressed in the direction of the right side of the figure, and the cylinder length becomes minimum L2. This position (i.e. second position) is where spring receiving member 14 comes in contact with spring guide member 16 (or the separation L0=0), and the right end of spring receiving member 14 comes in contact with cylinder cover 19. That is, the minimum value of the cylinder length is determined by the position where spring receiving member 14 comes in contact with spring guide member 16. The minimum cylinder length can be also determined by the position where stop pin 11 comes in contact with the left end of hollow 9 instead of being determined by the position where the separation L0 becomes zero.

Next, as shown in FIG. 2(C), fluid port 5 is switched to the low pressure from the state of FIG. 2(B). Thus, piston 4 is pressed by the force of first spring 15 towards the left and piston rod 3 is moved leftwards until the right end of spring receiving member comes in contact with both cylinder cover 19 and stopper 8. This position corresponds to the third position, in which stop pin 11 engages with hollow 9 and stays between both ends of hollow 9. Here, spring 15 should have sufficient force constant and length to be able to push piston rod 3 until stop pin 11 comes in contact with the right end of the hollow.

Next, when the external force is applied to piston rod 3 in the state of the pressure of fluid ports 5, 6 to be low, the piston rod 3 moves until stop pin 11 comes in contact with the right end of hollow 9, as shown in FIG. 2(D). In this process, spring receiving member 14 still contacts the left end of stopper 8, but separates from cylinder cover 19. This position corresponds to the fourth position in which the cylinder length is L4.

Since any restraining force is not exerted between both states of FIGS. 2(C) and 2(D), a piston rod 3 can move freely between the third position and the fourth position. This movable region is correlated with the free rotation region of the latchkey, through a crank mechanism, and therefore the latchkey rotates following the latchkey receptacle angle (90−α) to be easily inserted into the receptacle.

Finally, the maximum cylinder length L1 is achieved by applying the low and high pressure to fluid ports 5 and 6, respectively, as shown in FIG. 2(A). The pressure difference causes to push piston 4 leftwards and send out piston rod 3. However, if fluid port 6 is switched to the high pressure from the state of FIG. 2(B), (C) or (D), piston rod 3 is pressed leftwards and stop pin 11 may not be disengaged from hollow 9 because of the friction between stop pin 11 and the end of hollow 9. Therefore, it is preferable to attain the state of FIG. 2(A) through e.g., the state FIG. 2(E). That is, by switching firstly fluid port 5 and then fluid port 6 to the high pressure, stop pin 11 can be pushed back since stop pin 11 in not pressed to the right end of hollow 9. Thus, stop pin 11 can be securely disengaged from hollow 9. After that, fluid port 5 is switched to the low pressure, enabling piston rod 3 to move leftwards and stop at the position (first position) where piston 4 comes in contact with cylinder cover 7. This state is correspondent to the maximum cylinder length L1.

The transfer from the state of FIG. 2(A) to the state of FIG. 2(B), (C) or (D) is carried out by applying the high and low pressure to fluid ports 5 and 6, respectively. Since the pressure of fluid port 6 is low, stop pin 11 is extruded by the force of spring 12. However, tapered portion 10 formed around the tip of stopper 8 will push stop pin 11 back, which helps the piston rod move smoothly. Thus, the reliable movement of piston rod 3 is ensured.

As mentioned above, by using the cylinder of FIG. 1 and by selecting properly the position and length of hollow 9, the separation L0 between spring receiving member 14 and spring guide member 16, and the position of cylinder cover 7, it becomes possible to determine four positions of piston rod 3 precisely and arbitrarily.

Although the cylinder shown in FIG. 1 has the structure in which stop pin 11, hollow 9, spring receiving member 14 and so on are arranged in the opposite side of piston 4 against the feeding direction of piston rod, it is also possible to construct the cylinder which has the stop pin and so on in the same side of piston as the feeding direction.

Figure 3:
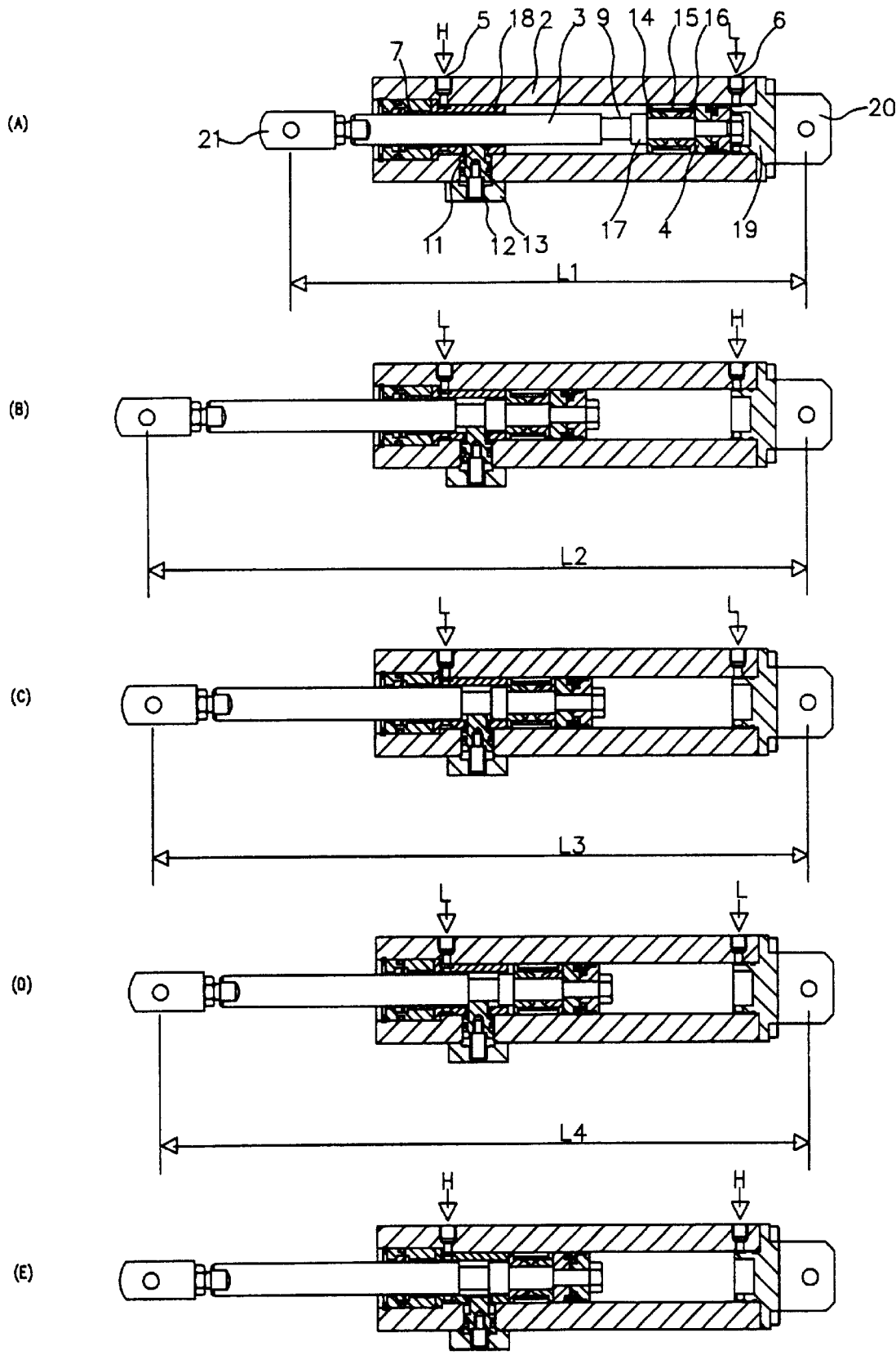
FIG. 3 is a sectional view showing another structure of a cylinder of the invention.

The cylinder having such structure is shown in FIG. 3. The stopper 8 having a tapered portion shown in FIG. 1 is left out in the example of FIG. 3. Instead a portion 17 of piston rod 3 works as a stopper which limits the leftward movement of spring receiving member 14, and a groove 9 (a hollow) is formed around the peripheral surface of piston rod 3. And spring guide member 16 is employed having the same shape as spring receiving member 14. Here, both members 14 and 16 of FIG. 3 can move axially and independently of piston rod 3 because neither of members is fixed to piston rod. Four states shown in FIGS. 3(A), (B), (C) and (D) are correspondent to four positions of piston rod 3 (L2>L3>L4>L1). Here, the room surrounded by piston stop 18 and cylinder cover 19 is the piston chamber.

The minimum cylinder length L1 is achieved by applying high and low pressure to fluid ports 5 and 6, respectively, as is shown in FIG. 3(A). The piston rod 3 moves rightwards and stops at the position where piston 4 comes in contact with cylinder cover 19 (first position). That is, the cylinder length L1 is determined by the position of cylinder cover 19. In this state, stop pin 11 is being pushed back by the high pressure fluid.

Next, fluid ports 5 and 6 are switched to the low and high pressure in the state shown in FIG. 3(A). Piston rod 3 is pushed out until stop pin 11 comes in contact with the right end of hollow 9 (FIG. 3(B)). That is, the maximum cylinder length L2 is determined by the position where stop pin 11 comes in contact with the right end of hollow 9 (the second position). Like the case of FIG. 1, the maximum cylinder length can also be determined by the position where spring receiving member 14 meets spring guide member 16 (i.e. L0=0).

The third position having the cylinder length of L3 is obtained, as shown in FIG. 3(C), by making both the fluid ports 5 and 6 low pressure in the state of FIG. 3(B). That is, first spring 15 extends to move the piston rod 3 in the right direction through the spring guide 16 to the position where spring receiving member 14 comes in contact with both stopper 17 and piston stop 18. Here, stop pin 11 is located between both ends of hollow 9.

Next, if external force is applied while both the fluid ports 5 and 6 are made low pressure, a piston rod 3 will move rightward and stop at the position where a stop pin 11 contacts the left end of hollow 9 as shown in drawing 3(D). This state corresponds to the fourth position.

The transfer from the state of FIG. 3(B), 3(C) or 3(D) to the state of FIG. 3(A) is made in the similar way described in FIG. 2(E). That is, fluid port 5 is switched to the high pressure immediately after fluid port 6 is switched to the high pressure, and then fluid port 6 is switched to the low pressure. Accordingly, stop pin 11 is easily pushed back, enabling smooth transfer to the state of FIG. 3(A).

Although the cylinders of this invention have been discussed in detail with reference to FIGS. 1–3, it should be understood that the present invention is not restricted to those embodiments. Various design changes, substitutes and modifications may be made thereto by those skilled in the art without departing from the spirit and scope of the invention. For example, hollow 9 formed on stopper 8 or piston rod 3 is not necessarily formed all around periphery, but on the only portion with which stop pin 11 engages. And spring guide member 16 can have any structure other than those shown in FIGS. 1 and 3 so long as the stable stretching of spring member is secured, irrespective of being fixed to piston. It is also possible to leave out spring guide member 16 in the invention. In this case, the separation L0 is defined as the distance between piston 4 and spring receiving member 14.

Figure 2:
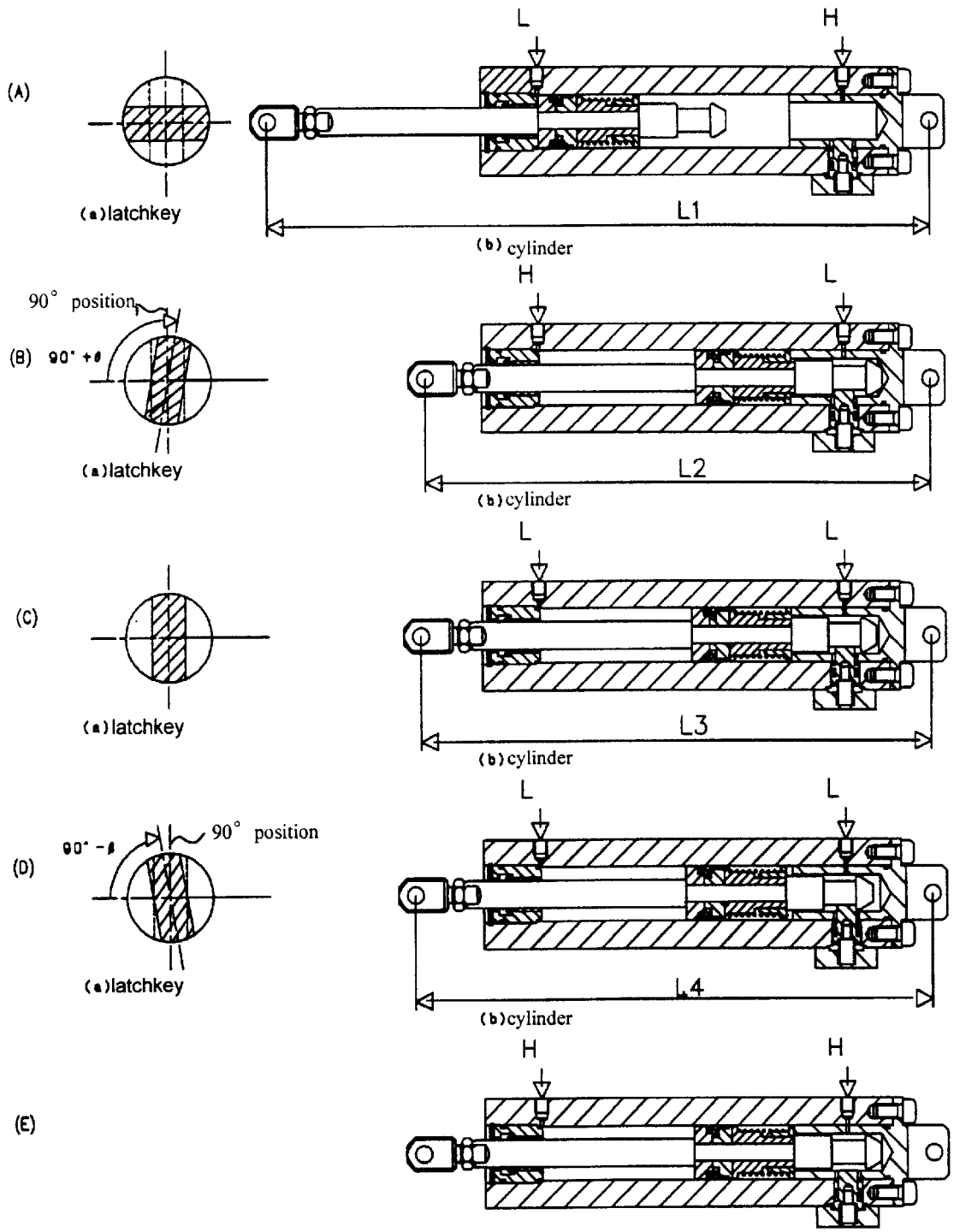
FIG. 2 is a sectional view explaining the operation principle of a cylinder.

In addition, the spring receiving member is not restricted to those shown in FIGS. 1–3. In other words, there is no limit on the structure of spring receiving member 14 so long as it can be stopped by cylinder cover 19 (or pistons stop 18) and stopper 8 and 17. Moreover, the spring members of this invention can be of any structure and material, such as coil spring, plate spring, sponge, and rubber if spring receiving member 14 and stop pin 11 can be pressed thereby.

(Load Port)

Next, load ports using cylinders of this invention will be described below.

Figure 12:
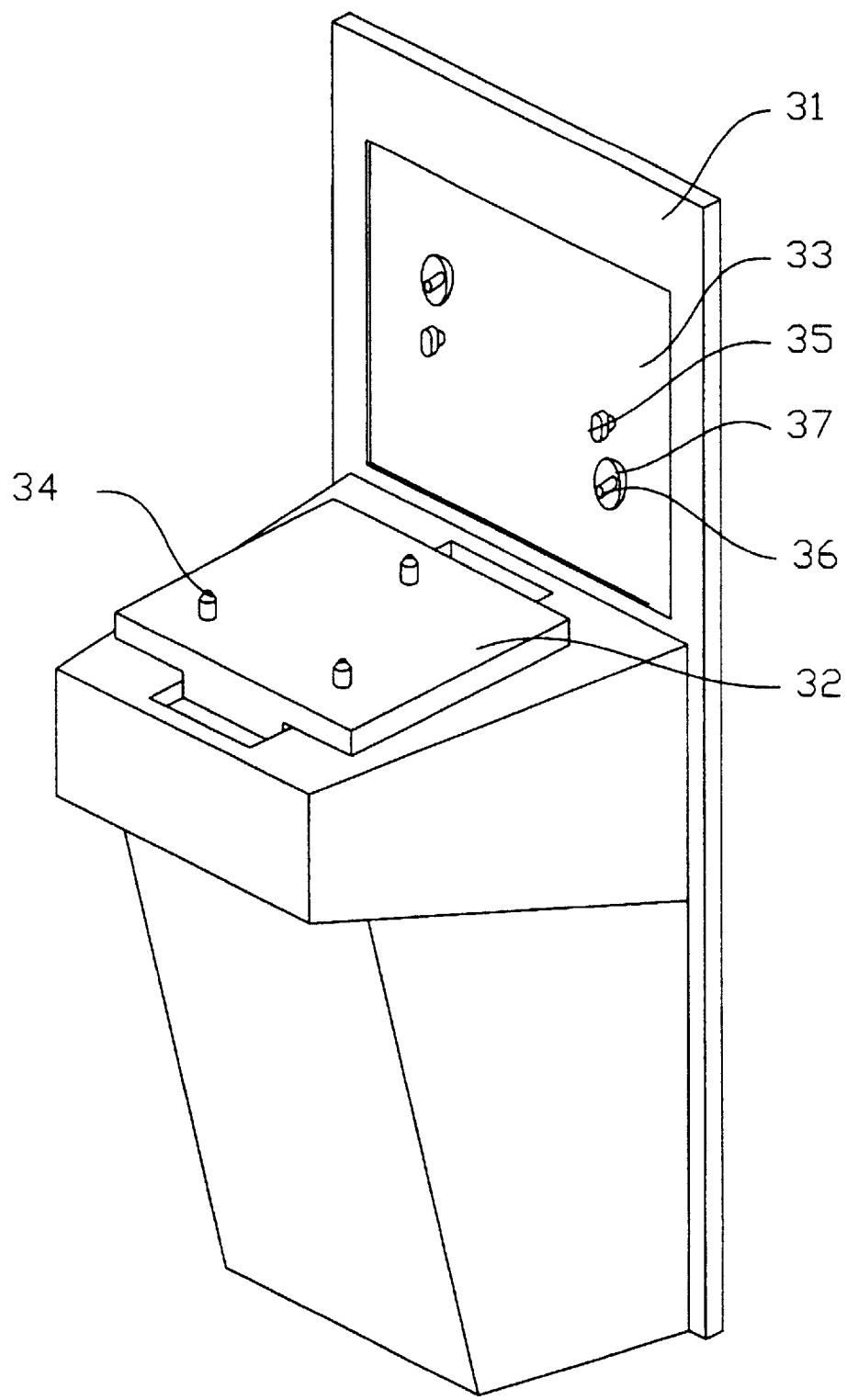
FIG. 12 is a perspective view showing the structure of a load port.
Figure 13:
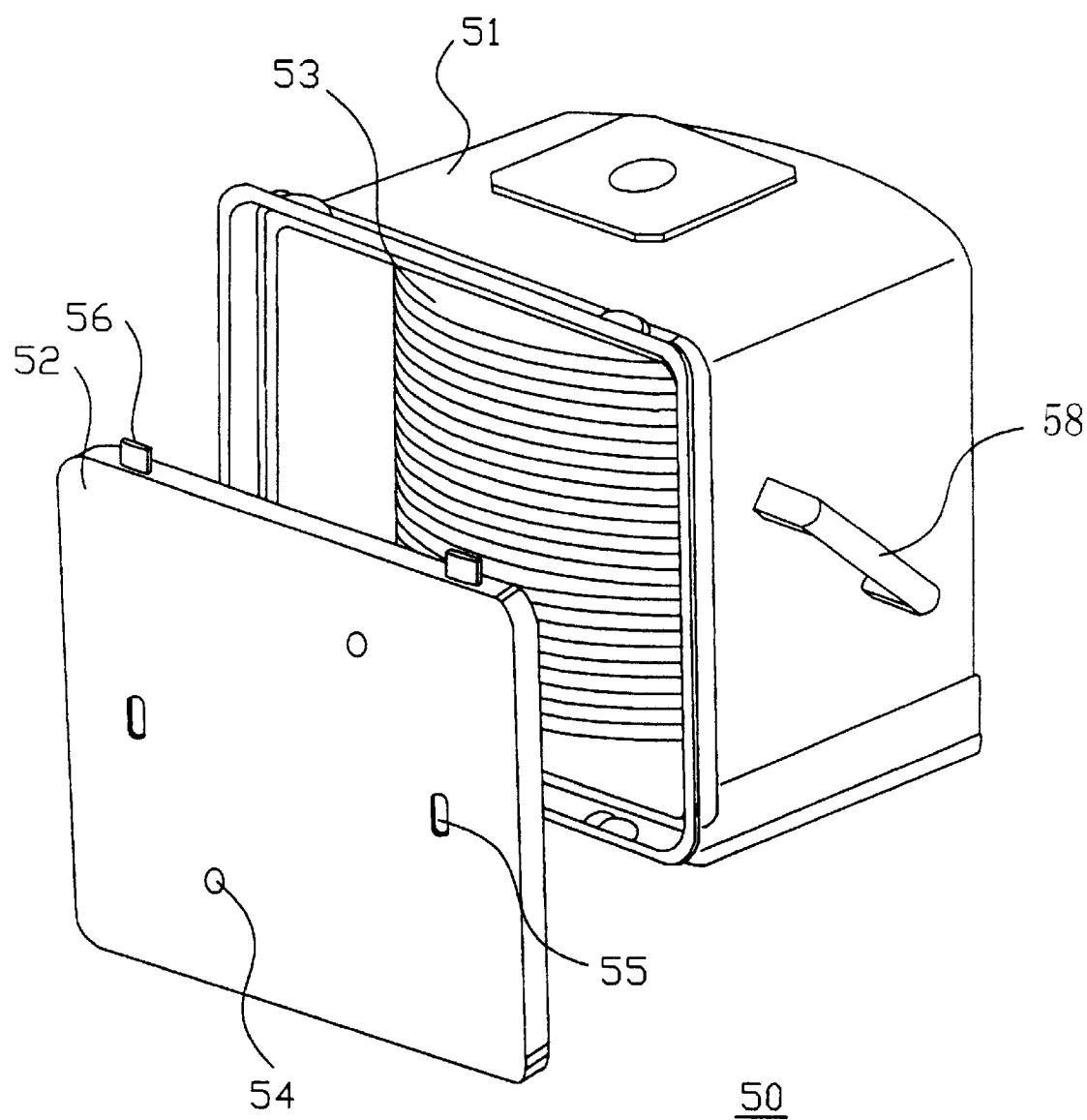
FIG. 13 is a perspective view showing the structure of an FOUP.

FIG. 12 is a perspective view which shows a structural example of a load port. A load port 30 shown in FIG. 12 is composed of a frames 31 with a opening therein for transferring substrates stored in FOUP 50 shown in FIG. 13, a stage 32 holding FOUP thereon and moving towards the frame, and a port door 33 which can be inserted into the opening and retracted backwards and then downwards from the opening when substrates in the FOUP are transferred. Three kinematic pins are mounted on stage 32 to align FOUP position. In the port door, two sets of latchkey 35 and cylinder 1 for driving the latchkey are installed to lock and unlock the latches of FOUP door (front door) 52. After the latches of FOUP door 52 are unlocked, port door 33 moves backwards and downwards together with FOUP door so as not to obstruct a substrate transfer robot from transferring substrates.

Figure 4:
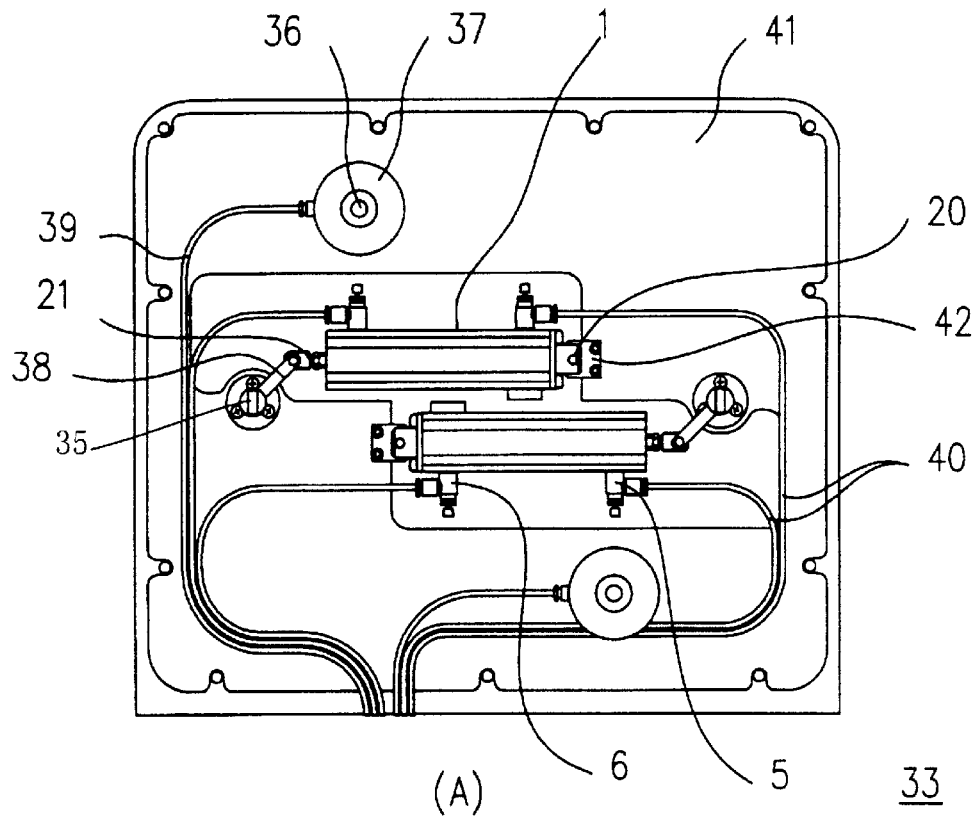
Figure 4:
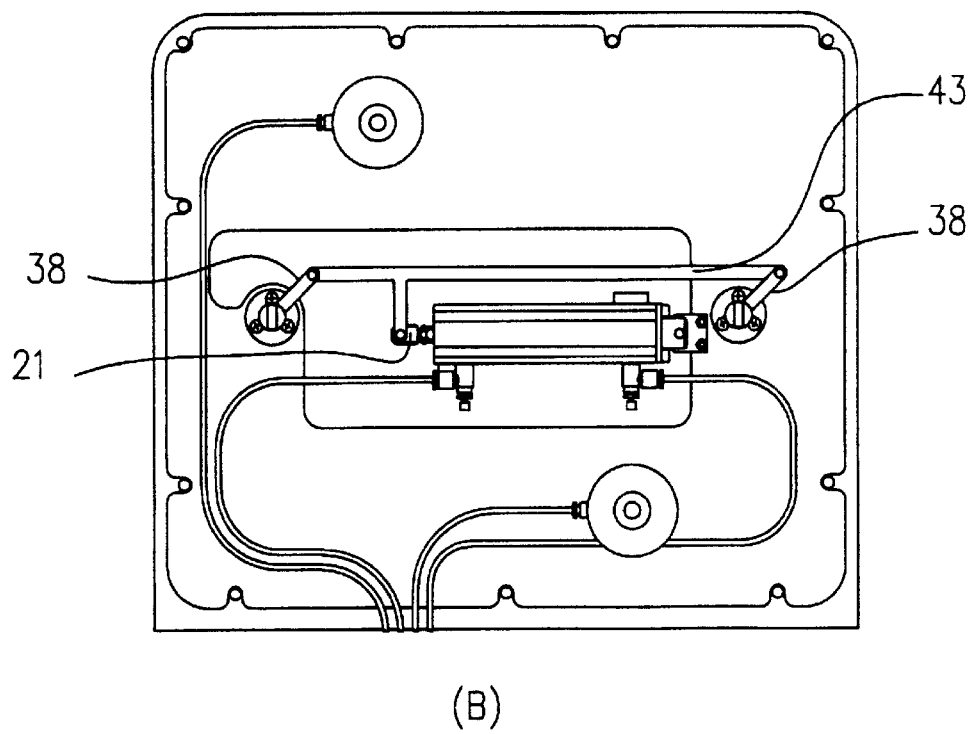

FIG. 4(A) is a schematic elevation view of the port door of which front cover is removed, seen from stage 32. Two sets of latchkey 35 and registration pin 36 are mounted at the positions corresponding to latch holes 55 and registration holes 54 of FOUP door 51. Each latchkey 35 is connected rotatably to a connecting member 38 which is also connected to a knuckle 21 installed at the end of the piston rod of air cylinder 1. As a result, the latchkeys rotate with the reciprocating motion of piston rod. The cylinder 1 has a support structure 20 of clevis type at the other end, which is fixed rotatably to a support member 42 installed on the rear cover 41 of the port door. And fluid ports 5, 6 of the cylinder are connected to switching valves through air pipe 40. The valves are further connected to a compressed air source.

A holding pads 37 is disposed surrounding registration pin 36 and connected to a vacuum equipment (not shown) through piping 39 to evacuate the space between pad 37 and FOUP door 52 after the FOUP door is fitted to the port door.

In order to prevent and overcome various problems due to the shape of latchkey receptacle and the improper position of latchkey receptacle, it is important for FOUP having any latchkey receptacle shape that the latchkey be smoothly inserted into the latchkey receptacle and the latchkey receptacles be always at the 90-degree position after the latches are locked. For this reason, the cylinder of the present invention, which moves the piston rod into four different positions, is preferably adopted. In other words, by adopting the cylinder of this invention, it becomes possible to prevent the damage and dust generation, irrespective of the shape of receptacle, while the latchkeys are being inserted into the latchkey receptacles for unlocking latches.

Figure 5:
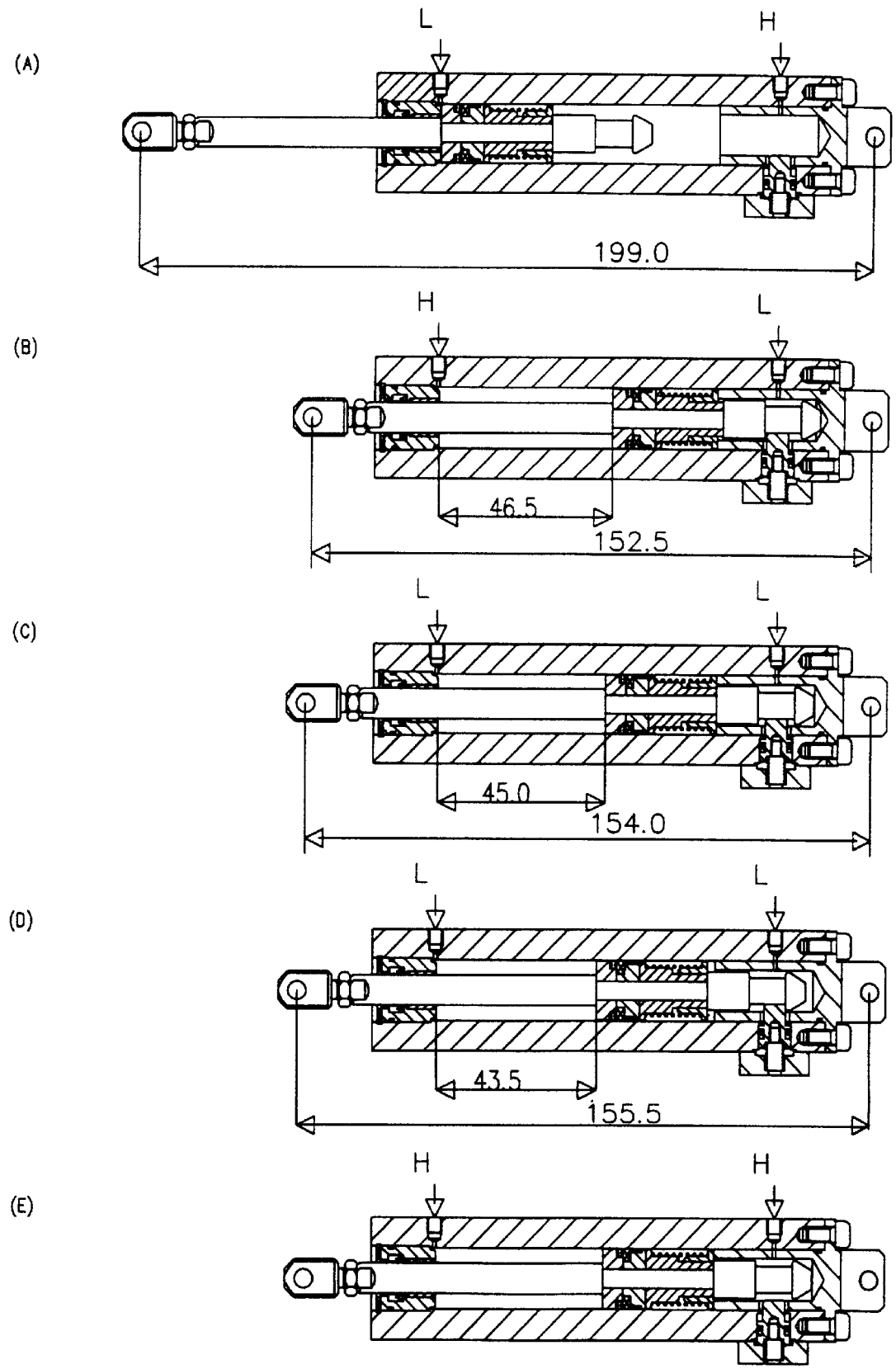
FIG. 5 is a sectional view showing the operation principle of a cylinder installed in a load port of the invention.
Figure 6:
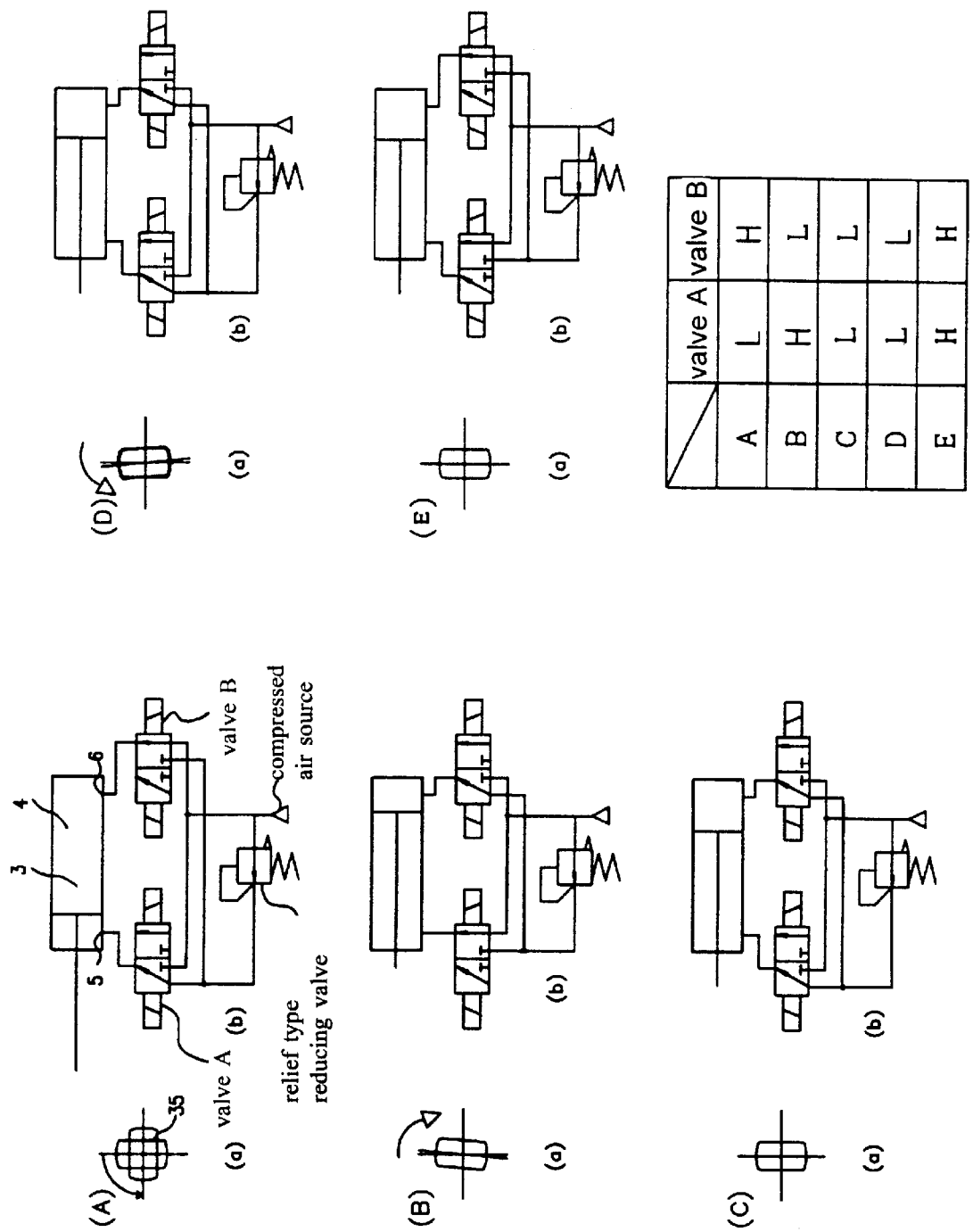
FIG. 6 is schematic diagram showing (a) latchkey position and (b) electromagnetic valve circuits for cylinders installed in a load port of the invention.

The opening and closing operation of the FOUP door is explained by the reference of drawings on the case where the port door is constructed using the air cylinder shown in FIG. 1. FIG. 5 is a sectional view of cylinder showing the latching operation, and FIG. 6 is a schematic diagram explaining (a) the latchkey positions and (b) the operation of electromagnetic switching valves that are connected to the fluid ports of cylinder. In FIG. 5, numerical values in millimeter of piston rod position are described concertedly in each operation.

FOUP 50 is placed on stage 32 of load port 30 and then aligned with the aid of three kinematic pins 34. At this stage, FOUP box 51 and doors 52 are being fixed to each other by the latches, and therefore the inside is perfectly sealed and free from outside atmosphere. Two latchkey receptacles stay at the 90-degree position, having been turned 90 degrees from horizontal direction. Two latchkeys 35 of the port door also stay at the 90-degree position.

When stage 32 is moved towards port door 33 by the driving mechanism (not shown), registration pins 36 are inserted into registration holes 54 of FOUP door 52 to align the FOUP box and door, and then latchkeys 35 are inserted into latchkey receptacles through latch holes 55. After port door 33 is fitted to FOUP door 52, holding pads 37 are evacuated by the vacuum equipment (not shown) to fix FOUP door 52 to port door 33. At this stage, the latches are ready to be unlocked to open FOUP door 52. The relationship between the movement of the piston rod and the supply of the air to fluid ports 5 and 6 are explained using FIGS. 5 and 6. Here, two cylinders perform the identical operation.

When latchkeys 35 are to be inserted into latchkey receptacles, two cylinders are at the state as is shown in FIG. 5(C), where valves A and B connected to fluid ports 5 and 6 are switched to the low pressure as shown in FIG. 6(C). The piston rod 3 which is pushed leftwards by the spring 15 lies at the position where stop pin 11 stays between both ends of hollow 9 (third position). The latchkeys are at the 90-degree position.

Under this circumstances, as the stage moves forwards and the latchkeys contacts the latchkey receptacles whose angle is in the vicinity of and less than 90 degrees, the latchkeys begin to rotate following the receptacle angle and thus the piston rod in a freely movable state is pulled through connecting member 38 to shift to the position (fourth position), as is shown in FIG. 5(D).

Thus, the latchkeys are engaged with the latchkey receptacles, and the front door of FOUP is brought in full contact with the port door by the adsorption pad.

The valve A at first and the valve B immediately thereafter are switched to the high pressure (FIG. 6(E)), causing piston 4 to move in the right direction by a small amount and push stop pin 11 back against the force of spring 12 since the both side of piston 4 are at high pressure. Thus, stop pin 11 is disengaged from hollow 9, as shown in FIG. 5(E).

At this stage, the valve A is switched to the low pressure (FIG. 6(A)). The leftward force applied to piston 4 pushes piston rod 3 out until piston 4 comes in contact with cylinder cover 7. Correspondingly, latchkeys 35 rotate to the 0-degree position. Latchkey receptacles also rotate together with latchkeys 35 to unlock the latches of the FOUP door (FIG. 5(A)).

Then, port door 33 is retracted backwards and downwards from the opening by the driving mechanism (not shown) so that a robot can transfer substrates. A substrate in the FOUP is transferred to a substrate process tool to be processed and is transferred back to the FOUP after a certain processing is made.

After all the substrates are processed, the operation to fix FOUP door 52 to FOUP box 51 is carried out. The port door 33 is moved upwards and then forwards to be inserted inside the opening of frame 31 by the drive mechanism until FOUP door 52 comes in contact with FOUP box 51. Then, valves A and B are switched to the high pressure and the low pressure, respectively (FIG. 6(B)). The piston rod 3 moves rightwards and stop pin 11 engages with hollow 9. The piston rod further advances beyond the position where the stop pin 11 contacts the right end of the hollow and stops at the position where the separation L0 is zero. In correspondence to this piston rod motion, latchkeys 35 rotate beyond the 90-degree position and stop at the (90+θ)-degree position (FIG. 5(B), FIG. 6(B)), which causes latchkey receptacles to be at the 90-degree position.

Depending on the difference between the widths of latchkey receptacle W1 and latchkey W2, latchkey receptacles may not reach the 90-degree position even when latchkeys are at the 90-degree position; for example, latchkey receptacles rotate only 86 degrees in the case where W1=6 mm and W2=5 mm. If the FOUP with this configuration of latchkey receptacles is transported to another load port, the substrates inside the FOUP may be contaminated because the seal is not sufficient, or the collision may occur between latchkey receptacles and latchkeys during the unlocking operation of latches. However, these problems are avoided by using the cylinder shown in FIG. 1. That is, latchkey receptacles always stay at the 90-degree position after locking operation mentioned above by turning the latchkeys more than 90 degrees to the (90+θ)-degree position.

When the valve A of port 5 is switched to the low pressure, piston rod 3 moves in the left direction by the force of spring 15 and stop pin 11 stays between both ends of hollow 9. That is, the piston rod returns to the third position (FIG. 5(C)). In correspondence to this motion, latchkeys return to the 90-degree position, and therefore both latchkey receptacles and latchkeys are set at the 90-degree position. After that, the FOUP will be transported to the load port of next process tool. There stable latching operation can be made without any trouble even if the load port is a conventional type since latchkey receptacle are at normal position.

Figure 7:
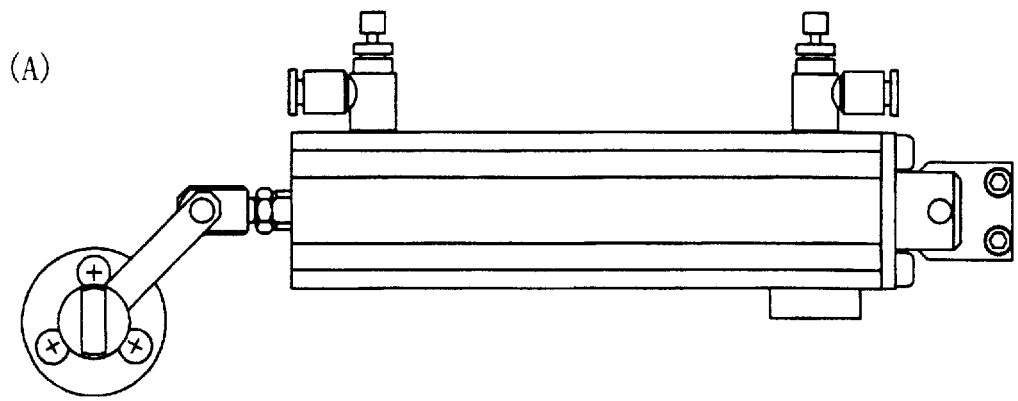
FIG. 7 is a plan view showing the movement of a cylinder with the linear motion of a piston rod.
Figure 7:
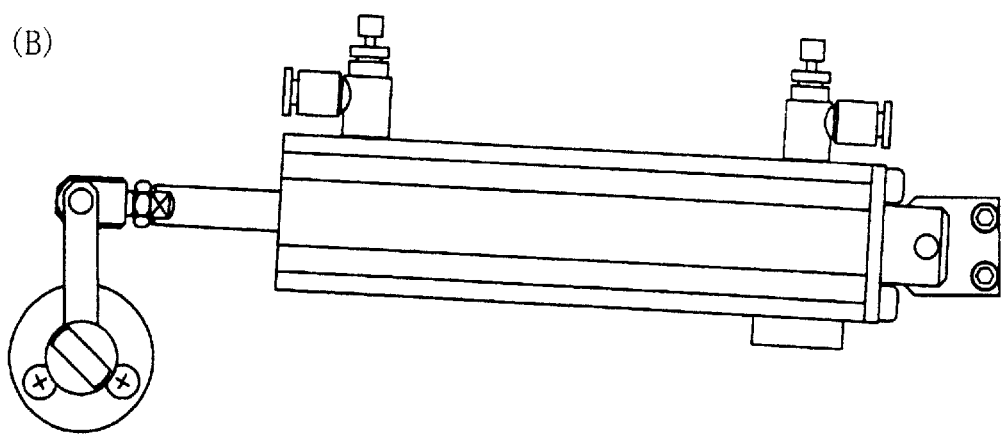
Figure 7:
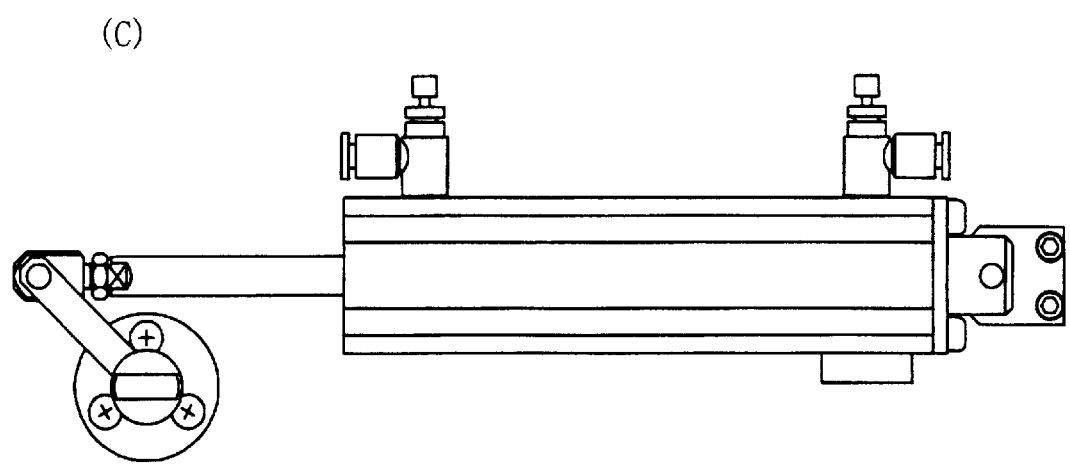
Figure 8:
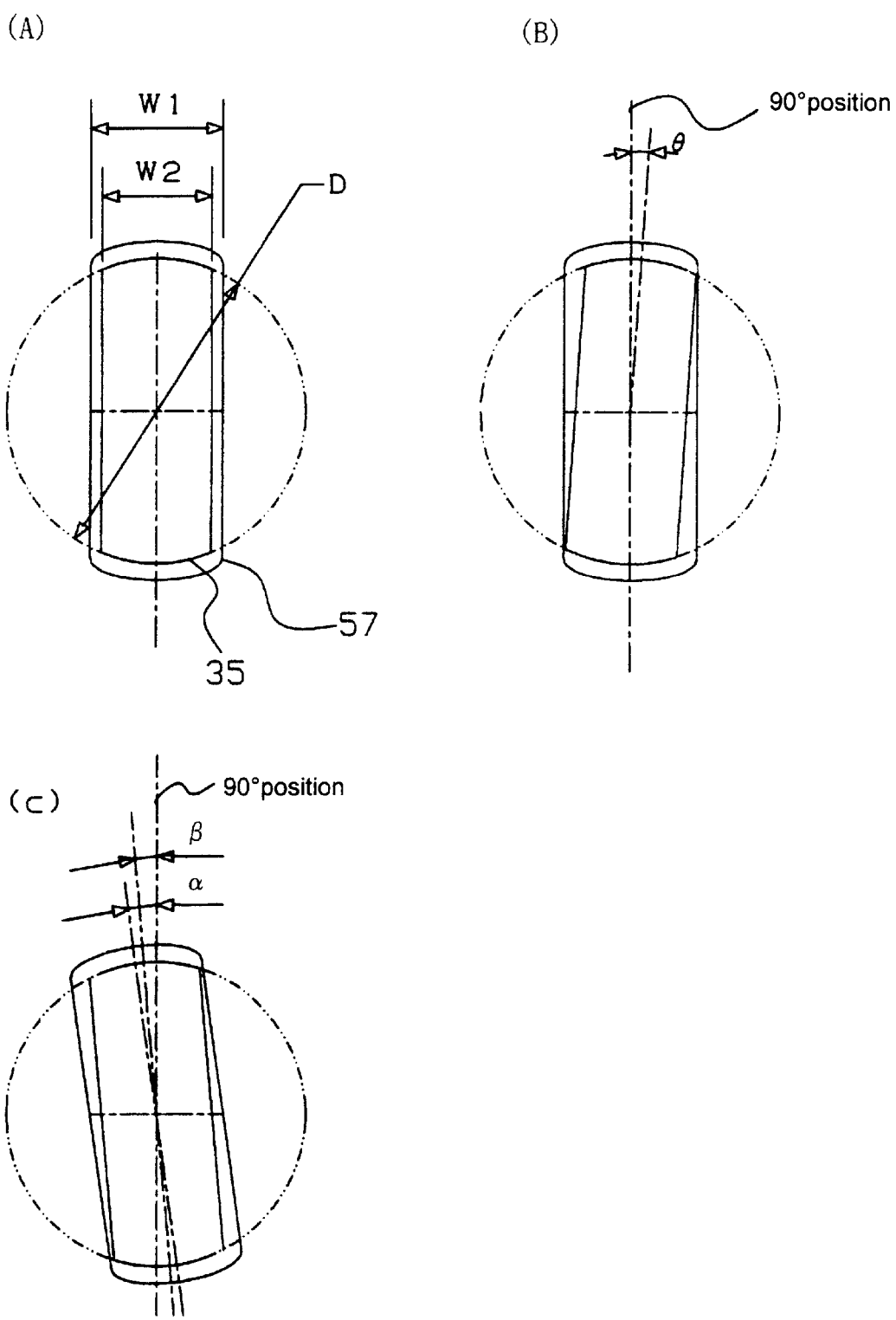
FIG. 8 is a schematic representation showing the relationship between latchkey and latchkey receptacle.
Figure 9:
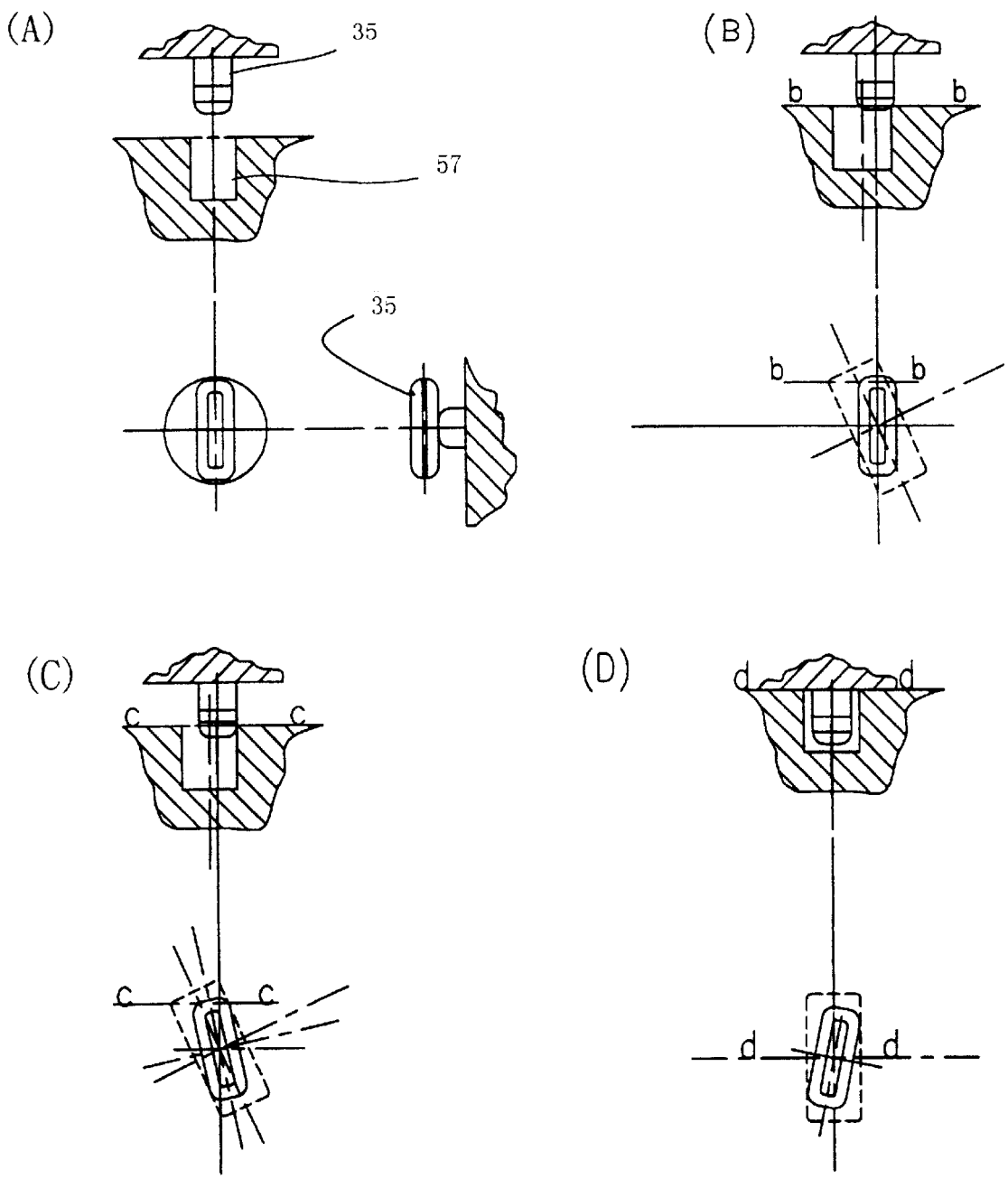
FIG. 9 is a schematic diagram showing a behavior how a latchkey is inserted into a latchkey receptacle.

In a series of latching operation, the cylinders accept the force perpendicular to their axis due to the linear motion of piston rod. Therefore, both ends 21 and 20 of cylinder are rotatably connected to connecting member 38 and support member 42, respectively so that the cylinder will move as shown in FIG. 7.

Figure 10:
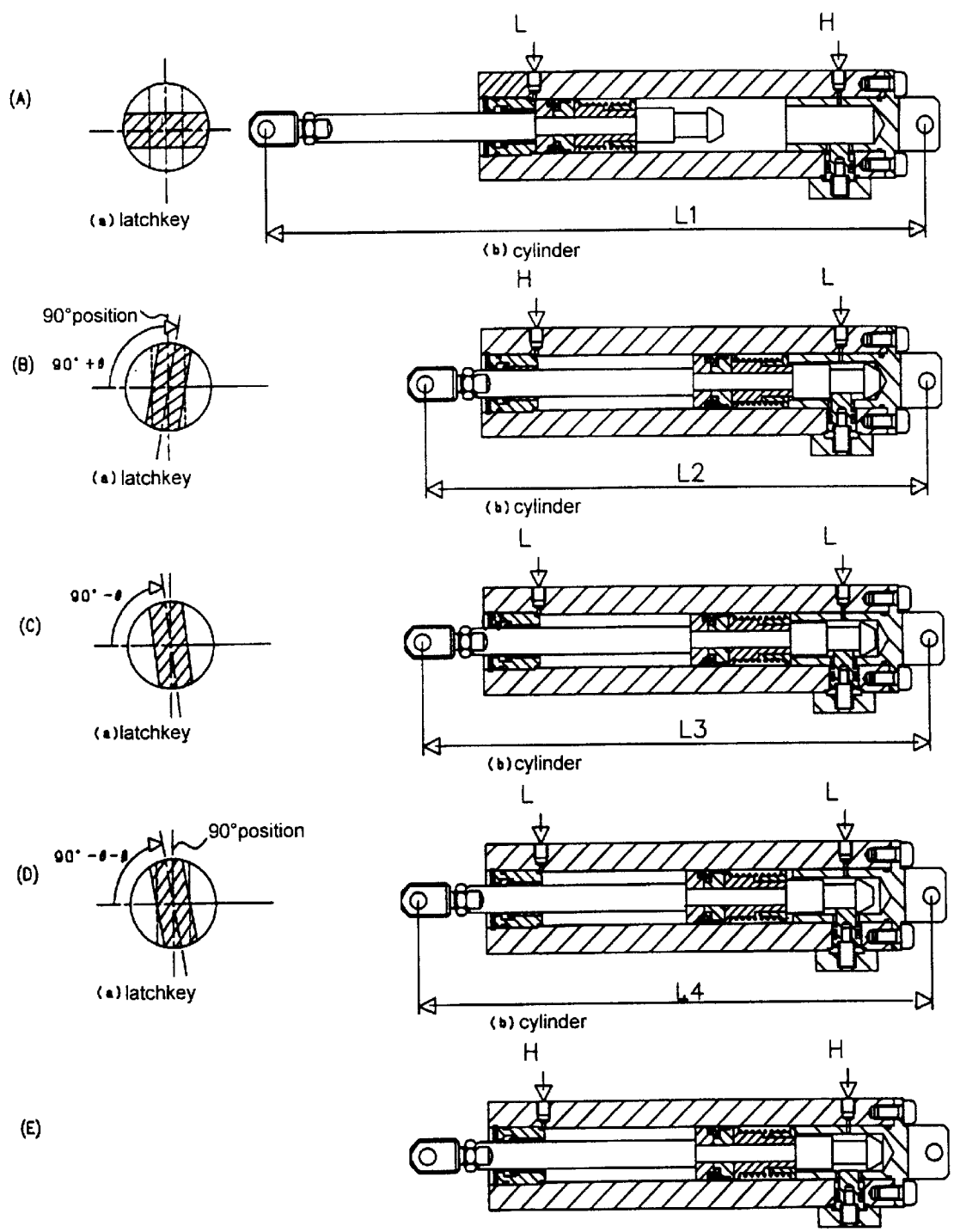
FIG. 10 is a schematic diagram showing a latchkey which is not at the 90-degree position.

The load port mentioned above is constructed so that the latchkeys are rotated (90+θ) degrees to make the latchkey receptacle at the 90-degree position and is returned to the 90-degree position in the course of locking latches, as shown in FIG. 10(C).

It is also possible to construct the load port by using the cylinder of this invention where the latchkeys are returned to the (90−θ)-position after the latches are locked. In this case, the latchkeys can also be inserted into the latchkey receptacles that are at the 90-degree position. Furthermore, since the latchkeys will rotate from (90−θ) to (90−θ−β) during the course of latchkey insertion (FIG. 10(D)), the latchkeys can be smoothly inserted into the latchkey receptacles whose angle is, for example, 81–82 degrees, much less than 90 degrees. That is, this load port can deal with the FOUP whose latchkey receptacle angle is largely deviated from 90 degrees.

In contrast, latchkeys are turned to the horizontal position to unlock the latches as mentioned above. However, if the FOUP has a large width W1 of latchkey receptacles as compared with that of latchkey W2, latchkey receptacles will not rotate to the angle range of 0±1 degree, even if latchkeys are turned to 0 degree, which results in failing to unlocking the latches. Therefore, it is preferable to turn latchkeys beyond 0 degree for securely unlocking the latches; that is, latchkeys should be rotated to the (−θ) degree position. The angle of (−θ) is determined by the position where piston 4 comes in contact with cylinder cover 7.

Although the load port using cylinders described in FIG. 1 has been mentioned so far, a cylinder shown in FIG. 3 is also available for the load port of this invention, in which cylinders are installed perpendicularly from the configuration of FIG. 4(A) in the port door.

And unlike the port door of FIG. 12 which has two cylinders to drive respective latchkeys, it is also possible to realize the similar latching operation by single cylinder as shown in FIG. 4(B). In the example of FIG. 4(B), two connecting members 38 and knuckles 21 of cylinder are connected using, e.g., a T-shaped connecting member 43. The linear motion of single cylinder causes two latchkeys to rotate in phase to lock and unlock the latches.

Furthermore, in the above-mentioned method to separate the FOUP door from the FOUP box, the port door with the FOUP door is retracted backwards and then downwards from the opening. However, in the present invention, a variety of separation method can be adopted, such as a method in which the FOUP box is retreated a little to separate the FOUP door after the port door is fixed to the FOUP door, a method in which both the port door and FOUP door are moved downwards without moving the FOUP box, or a method in which both the port door and FOUP door are tilted from vertical position to horizontal position.

(Production System)

A semiconductor production system of this invention will be explained by reference to FIG. 11. In a semiconductor factory, wafers 53 to be processed are stored in FOUP 50 and transported between process tools 61. The FOUP 50, which stores wafers 53 with the diameter of 300 mm is too heavy (more than 8 Kg) to carry by hand. Therefore, automating transport equipments such as OHT (Overhead Hoist Transfer) 60 will be employed for the transportation of FOUPs.

Figure 11:
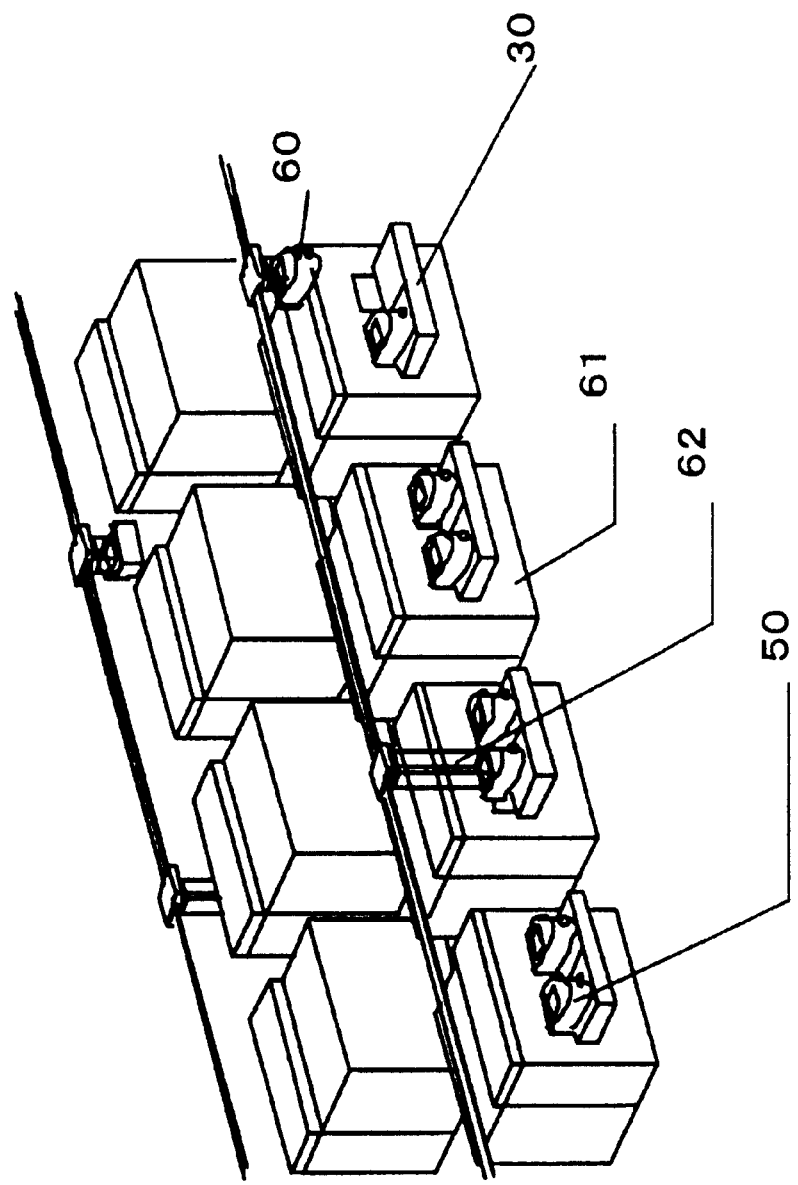
FIG. 11 is a perspective view showing a semiconductor production system of this invention.

In the example of FIG. 11, OHT 60 transports FOUP 50 that stores wafers 53 to be processed from a stocker to above the process tool 61 (for example, etching apparatus).

FOUP 50 is lowered on load port 30 of process tool 61 with a hoist mechanism 62 and placed on a prescribed position (the transfer position). The V-grooves formed on the bottom surface of FOUP 50 couple with kinematic pins 34 of load port 30, which leads FOUP to the settlement position.

Then, hoist mechanism 62 is removed from FOUP 50 to set FOUP on load port. After FOUP 50 is moved forwards and fixed to port door 33, latchkeys 35 are turned to unlock the latches of FOUP door 52.

Then, FOUP door 52 is detached from FOUP box 51 by driving the opening and closing mechanism and is moved to the lower part of process tool 61. A wafer 53 is taken out from the front of FOUP 50, and is transferred to the processing unit (not shown) by a wafer transfer robot installed in process tool 61. Until the semiconductor chip is completed, this opening and closing operation of FOUP door 52 will be repeated about 500 to 1000 times.

A wafer 53 is returned to FOUP 50 by the wafer transfer robot after processing. After the prescribed processing on each wafer 53 stored in FOUP 50 is carried out, FOUP door 52 is inserted into FOUP box 51 by driving the opening and closing mechanism. Then, latchkeys 35 are turned to the position of 90+θ degree and then returned to the 90-degree position using the cylinder of this invention. This fixes FOUP door 52 to FOUP box 51.

After that, FOUP 50 is moved back to the transfer position. According to the transport demand from the load port, an empty OHT 60 is moved to above the load port 30. FOUP 50 on the load port 30 is lifted by a robot hand (not shown) of hoist mechanism 62.

FOUP 50 is carried by OHT 60 to the stocker for temporary storage, and then carried to the next process tool (for example, ashing apparatus). The desired circuit can be formed on wafer 53 by the repetition of such procedure (substrate container transportation method).

Although the automating transportation system using OHT 60 has been explained so far, the present invention is not restricted to this system; that is, not only other automatic transportation systems such as AGV (Automated Guided Vehicle) and RGV (Rail Guided Vehicle), but the manual transportation systems using PGV (Person Guided Vehicle) are also available.

It is desirable in the production method and system of this invention that load port 30 of this invention is installed to all process tools 61. However, even a partial replacement with the load port of this invention make possible remarkably stable production as compared with conventional production method and system.

Figure 14:
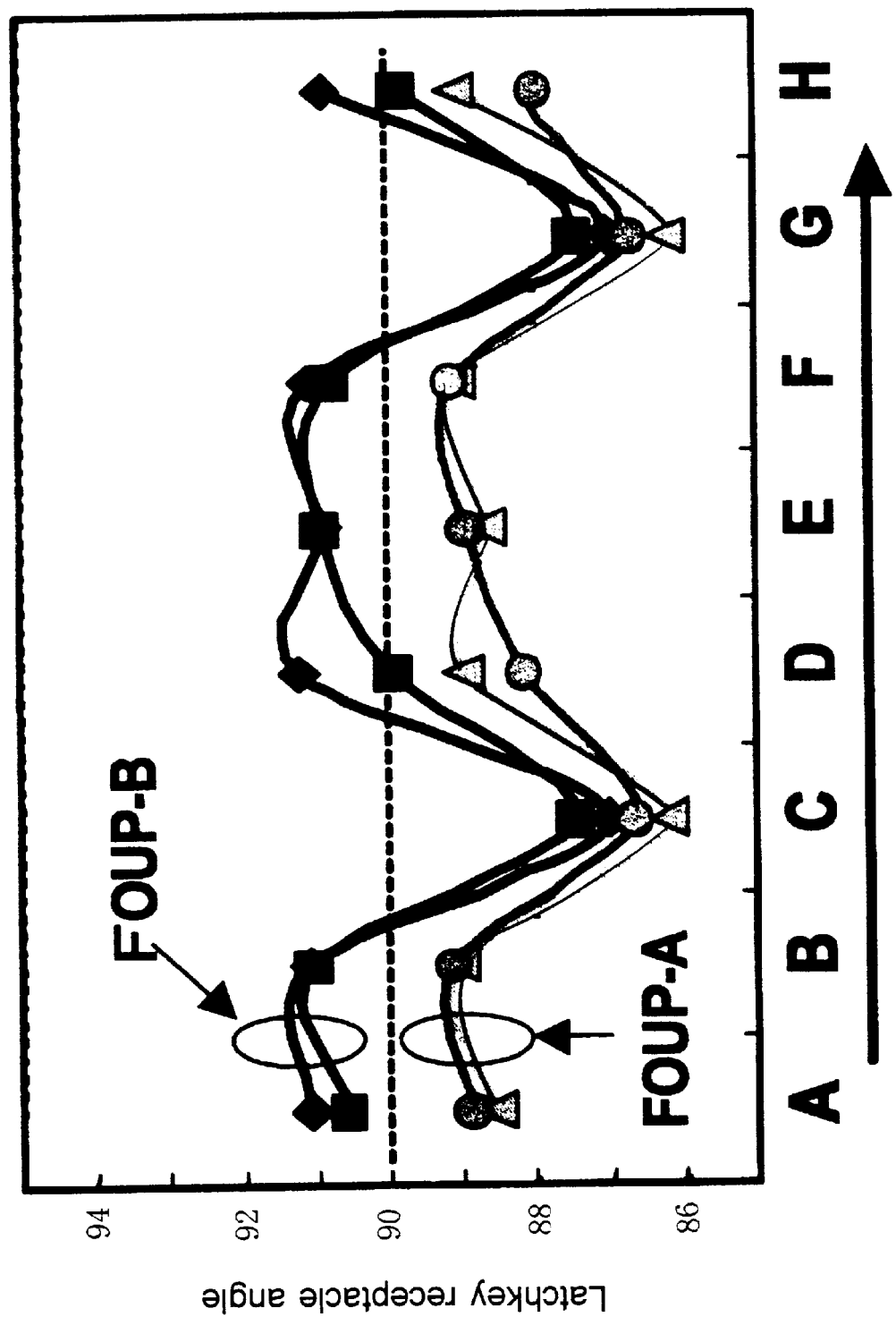
FIG. 14 is a graphical representation showing the latchkey receptacle angle of the various load port.

For example, even when FOUP with a latchkey receptacle angle of (90−α) is transported into the load port of this invention, the latchkeys are rotated to (90−β) degrees following the latchkey receptacle angle during the course to fit the port door to the FOUP door, and can be inserted into the latchkey receptacles. That is, since the latchkeys are smoothly rotated when the latchkeys are inserted into the latchkey receptacles, excessive force will not be exerted on the latchkeys or latchkey receptacles. This makes it possible to prevent the damage of the latchkeys and the latchkey receptacles and the particle generation accompanying therewith, and therefore to carry out stable, reliable production. For example, in the semiconductor production system using eight load port A–H as shown in FIG. 14, the latchkey receptacle angle of FOUP will be 86–88 degrees, less than 90 degrees, after FOUP is closed by the conventional load port C or G. When this FOUP is transported to the load port D or H of this invention, the latch opening and closing operation can be stably carried out without causing troubles mentioned above since the latchkeys are inserted into the latchkey receptacles following latchkey receptacle angle of 86–88 degrees. In addition, since FOUP with a latchkey receptacle angle of 90 degrees can be sent out to the next load port, stable latch opening and closing operation will be attained even if the next load port is the conventional one.

Thus, the partial replacement of conventional load ports with new type load ports in the conventional product system makes possible the stable production and therefore the improvement of the production system at low cost.

APPLICATION TO THE INDUSTRY

As mentioned above, the present invention provides a cylinder, which moves precisely a piston rod into four different positions. And the transfer among four positions can be carried out stably and smoothly. Moreover, since the cylinder of this invention is constructed with less number of parts, resulting in remarkable cost reduction and the miniaturization of cylinder.

By constructing a load port with the cylinder of this invention, it becomes possible to provide the reliable load port that securely performs smooth latching operation for opening and closing FOUP.

Moreover, even in the case where the latchkey receptacles are not the 90-degree position, since latchkeys can rotate following their angle and engage with the receptacles, the collision and therefore the damage of latchkeys and latchkey receptacles can be avoided. This will extend the lifetime of FOUP, leading to the cost reduction and the reduction of waste. In addition, it becomes possible to lock and unlock the latches with single cylinder by connecting two latchkeys. Consequently, the cost of port door and load port can be remarkably reduced.

With the production system of this invention, it is also possible to carry wafer between process tools in the clean environment securely sealed and to have wafers stably processed at each process tool. That is, the production system makes possible the mass-production of semiconductor integrated circuits, and the cost reduction related to the clean room.

What is claimed is:

1. A cylinder having a piston rod which moves to and stops at four positions with the pressure of fluid applied to a piston through two fluid ports, comprising;

a spring receiving member placed coaxially with said piston rod in a piston room of a cylinder tube so that the movement of said spring receiving member is limited by one end of said piston room;

a first spring member to separate said spring receiving member from said piston;

a stopper formed on said piston rod to limit said spring receiving member from moving in the opposite direction to said piston;

a hollow formed on the periphery of said piston rod at farther position from said piston than said stopper; and a stop pin installed in said cylinder tube to be pressed in the direction of said hollow by a second spring member to engage with said hollow, wherein the movable length of said piston rod while said stop pin is engaged with said hollow is larger than a movable distance of said spring receiving member from said piston.

2. The cylinder according to claim 1, wherein the four positions of the piston rod are determined by the first position where said piston comes in contact with a first end of said piston room which is most distant from said stop pin, the second position where said spring receiving member comes in contact with a the second end of said piston room and the distance between said piston and said spring receiving member becomes minimum, the third position where said spring receiving member comes in contact with both said second end of said piston room and said stopper, and the fourth position where said stop pin comes in contact with an end of said hollow most distant from said piston.

3. A load port which is composed of: a frame having an opening; a stage holding a substrate container having a front door to seal inside airtight using a latch; and a port door having a latchkey and a cylinder to rotate said latchkey, and which locks and unlocks said latch by rotating said latchkey in the state where said front door is in full contact with said port door and said latchkey is engaged with a latchkey receptacle of said front door, wherein said latchkey is rotated to adapt to the angle deviation of said latchkey receptacle as said front door is brought in contact with said port door so that said latchkey is inserted into and engaged with said latchkey receptacle.

4. The load port according to claim 3, wherein said cylinder has a piston rod which moves to and stops at four positions with the pressure of fluid applied to a piston through two fluid ports and comprises:

a spring receiving member placed coaxially with said piston rod in a piston room of a cylinder tube so that the movement of said spring receiving member is limited by one end of said piston room;

a first spring member to separate said spring receiving member from said piston;

a stopper formed on said piston rod to limit said spring receiving member from moving in the opposite direction to said piston;

a hollow formed on the periphery of said piston rod at farther position from said piston than said stopper; and a stop pin installed in said cylinder tube to be pressed in the direction of said hollow by a second spring member to engage with said hollow, wherein the movable length of said piston rod while said stop pin is engaged with said hollow is larger than a movable distance of said spring receiving member from said piston.

5. The load port according to claim 4, wherein the four positions of the piston rod are determined by the first position where said piston comes in contact with a first end of said piston room which is most distant from said stop pin, the second position where said spring receiving member comes in contact with a second end of said piston room and the distance between said piston and said spring receiving member becomes minimum, the third position where said spring receiving member comes in contact with both said second end of said piston room and said stopper, and the fourth position where said stop pin comes in contact with an end of said hollow most distant from said piston.

6. The load port according to claim 3, wherein when said latchkey receptacle is turned to the vertical position to lock said latch, said latchkey is turned more than 90 degrees from the horizontal position.

7. The load port according to claim 6, wherein said cylinder has a piston rod which moves to and stops at four positions with the pressure of fluid applied to a piston through two fluid ports and comprises:

a spring receiving member placed coaxially with said piston rod in a piston room of a cylinder tube so that the movement of said spring receiving member is limited by one end of said piston room;

a first spring member to separate said spring receiving member from said piston;

a stopper formed on said piston rod to limit said spring receiving member from moving in the opposite direction to said piston;

a hollow formed on the periphery of said piston rod at farther position from said piston than said stopper; and a stop pin installed in said cylinder tube to be pressed in the direction of said hollow by a second spring member to engage with said hollow, wherein the movable length of said piston rod while said stop pin is engaged with said hollow is larger than movable distance of said spring receiving member from said piston.

8. The load port according to claim 7, wherein the four positions of the piston rod are determined by the first position where said piston comes in contact with a first end of said piston room which is most distant from said stop pin, the second position where said spring receiving member comes in contact with a second end of said piston room and the distance between said piston and said spring receiving member becomes minimum, the third position where said spring receiving member comes in contact with both said second end of said piston room and said stopper, and the fourth position where said stop pin comes in contact with an end of said hollow most distant from said piston.

9. A production system, comprising a load port which is composed of: a frame having an opening; a stage holding a substrate container having a front door to seal inside airtight using a latch; and a port door having a latchkey and a cylinder to rotate said latchkey, and which locks and unlocks said latch by rotating said latchkey in the state where said front door is in full contact with said port door and said latchkey is engaged with a latchkey receptacle of said front door, wherein said latchkey is rotated to adapt to the angle deviation of said latchkey receptacle as said front door is brought in contact with said port door so that said latchkey is inserted into and engaged with said latchkey receptacle.

10. The production system according to claim 9, wherein when said latchkey receptacle is turned to the vertical position to lock said latch, said latchkey is turned more than 90 degrees from the horizontal position.

11. The production system according to claim 9, wherein said cylinder has a piston rod which moves to and stops at four positions with the pressure of fluid applied to a piston through two fluid ports and comprises:

a spring receiving member placed coaxially with said piston rod in a piston room of a cylinder tube so that the movement of said spring receiving member is limited by one end of said piston room;

a first spring member to separate said spring receiving member from said piston;

a stopper formed on said piston rod to limit said spring receiving member from moving in the opposite direction to said piston;

a hollow formed on the periphery of said piston rod at farther position from said piston than said stopper; and a stop pin installed in said cylinder tube to be pressed in the direction of said hollow by a second spring member to engage with said hollow, wherein the movable length of said piston rod while said stop pin is engaged with said hollow is larger than movable distance of said spring receiving member from said piston.

12. The production system according to claim 11, wherein the four positions of the piston rod are determined by the first position where said piston comes in contact with a first end of said piston room which is most distant from said stop pin, the second position where said spring receiving member comes in contact with a second end of said piston room and the distance between said piston and said spring receiving member becomes minimum, the third position where said spring receiving member comes in contact with both said second end of said piston room and said stopper, and the fourth position where said stop pin comes in contact with an end of said hollow most distant from said piston.

* * * * *